United States Patent [19]
Carney et al.

[11] Patent Number: 5,886,396
[45] Date of Patent: Mar. 23, 1999

[54] LEADFRAME ASSEMBLY FOR CONDUCTING THERMAL ENERGY FROM A SEMICONDUCTOR DIE DISPOSED IN A PACKAGE

[75] Inventors: Lauriann T. Carney, Gilbert; William M. Strom, Chandler, both of Ariz.

[73] Assignee: Motorola, Inc., Schaumburg, Ill.

[21] Appl. No.: 463,112

[22] Filed: Jun. 5, 1995

[51] Int. Cl.⁶ .................................................. H01L 23/495
[52] U.S. Cl. ........................ 257/666; 257/675; 257/712; 438/122
[58] Field of Search .................................. 257/666, 712, 257/713, 675; 438/122

[56] References Cited

U.S. PATENT DOCUMENTS

| | | |
|---|---|---|
| 3,423,516 | 1/1969 | Segerson . |
| 3,574,815 | 4/1971 | Segerson . |
| 3,766,977 | 10/1973 | Pravda et al. . |
| 3,899,305 | 8/1975 | Hilgers et al. . |
| 4,012,768 | 3/1977 | Kirk et al. . |
| 4,661,887 | 4/1987 | Lin . |
| 4,807,018 | 2/1989 | Cellai . |
| 5,384,286 | 1/1995 | Hirai ........................................ 257/796 |
| 5,430,331 | 7/1995 | Hamzehdoost et al. ................ 257/666 |

FOREIGN PATENT DOCUMENTS 57-84157  5/1982  Japan .

*Primary Examiner*—Peter Toby Brown
*Assistant Examiner*—Roy Potter
*Attorney, Agent, or Firm*—Rennie William Dover

[57] ABSTRACT

A semiconductor die (32) is disposed on a heat sink (22) in an electronic package (10). During assembly, a leadframe (20) is connected to the heat sink (22) by down-set tabs (14, 28), which are offset from the heat sink (22) and disposed within the boundary (19) in which the final package (10) will be molded. Individual heat sinks (22) are pre-out prior to molding the final packages (10). In one roach, pins (36) are used to connect down-set tabs (14, 28) to heat sink (22).

16 Claims, 2 Drawing Sheets

LEADFRAME ASSEMBLY FOR CONDUCTING THERMAL ENERGY FROM A SEMICONDUCTOR DIE DISPOSED IN A PACKAGE

BACKGROUND OF THE INVENTION

The present invention relates, in general, to electronic packages and, more particularly, to electronic packages including a heat sink for heat dissipation from a semiconductor die.

Power transistors typically generate considerable heat which must be transferred from a semiconductor die to the external environment. Usually, this is accomplished by placing the die on a heat sink which is used as a medium to transfer heat from the die to, for example, an underlying printed circuit board. As is conventional, a plastic package typically encapsulates the die and a portion of the heat sink to provide what is known as a power electronic package.

In the formation of a power electronic package, a leadframe is used to support the package leads while the semiconductor die and a portion of the heat sink are encapsulated by a molding compound, which is cured to provide the final package. Typically, a single leadframe is used to mold many such packages simultaneously. In a prior approach, a continuous strip of heat sinks is supported below the leadframe so that a row of final packages may be molded. The heat sink strip is supported beneath the leadframe during the molding process by attaching portions of the strip to mounting tabs on the leadframe by a technique known as mechanical staking. This staking requires that regularly-spaced portions of the heat sink strip be elevated to provide an offset between the strip and the leadframe. However, staking requires considerable leadframe area that could otherwise be used for forming additional packages and also requires that the thickness of the heat sink strip be sufficient to withstand the deformation applied to the strip to elevate the regularly-spaced portions used for staking. One problem with a thick heat sink strip is that the final package thickness is increased. Also, a thicker heat sink strip is more difficult to cut after molding, and this cutting puts significant stress on the die, which can result in a cracked die or a loss of adhesion between the die and the heat sink.

Another problem with the use of a continuous strip of heat sinks is that a mismatch of mechanical stress, thermal expansion, or pitch between the strip and the leadframe often results in induced coil set and camber or other manufacturing problems, which thereby prevents the formation of reliable packages. Another limitation with the use of a continuous heat sink strip is the inability to form a four-sided power package with an exposed heat sink. This is so because leads from the leadframe cannot extend over those portions of the heat sink strip used to connect each of the individual heat sinks to one another. Instead, with this prior approach only one, two, or three-sided packages can be formed.

Accordingly, there is a need for a power package that uses less area for staking, uses a thinner heat sink material, reduces manufacturing problems associated with mismatches between the heat sink strip and the leadframe, and permits the formation of four-sided packages with exposed heat sinks.

DETAILED DESCRIPTION OF THE DRAWINGS

Briefly stated, the present invention provides a leadframe assembly for conducting thermal energy from a semiconductor die disposed in an electronic package. The leadframe assembly includes a heat sink for supporting the die and a leadframe having a plurality of leads corresponding to the die. The leadframe has at least one down-set tab connected to the heat sink so that the leadframe is supported above the heat sink, and the down-set tab is disposed substantially within the package. The use of such a down-set tab significantly reduces the leadframe surface area required for connecting the leadframe and heat sink during assembly. Further, the use of the down-set tab permits each individual heat sink to be cut prior to molding the package because each heat sink is now attached to the leadframe by one or more down-set tabs, and thus the heat sinks need not be connected by a continuous strip of heat sink material as in prior approaches.

Figure 1:
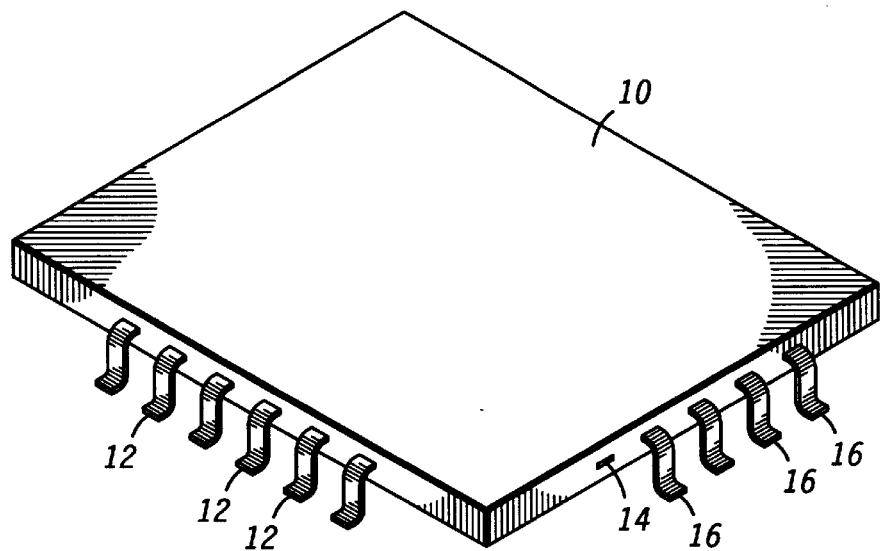
FIG. 1 is a perspective view of an electronic package formed from a leadframe assembly according to the present invention.

The present invention can be more fully described with reference to FIGS. 1–4. FIG. 1 illustrates a package 10 having leads 12 and 16 protruding therefrom. An end of a down-set tab 14 is shown flush with package 10 because no external electrical connection is required to down-set tab 14 in this particular embodiment. However, as discussed below, tab 14 can also be formed into a lead as done for leads 12 and 16.

Figure 2:
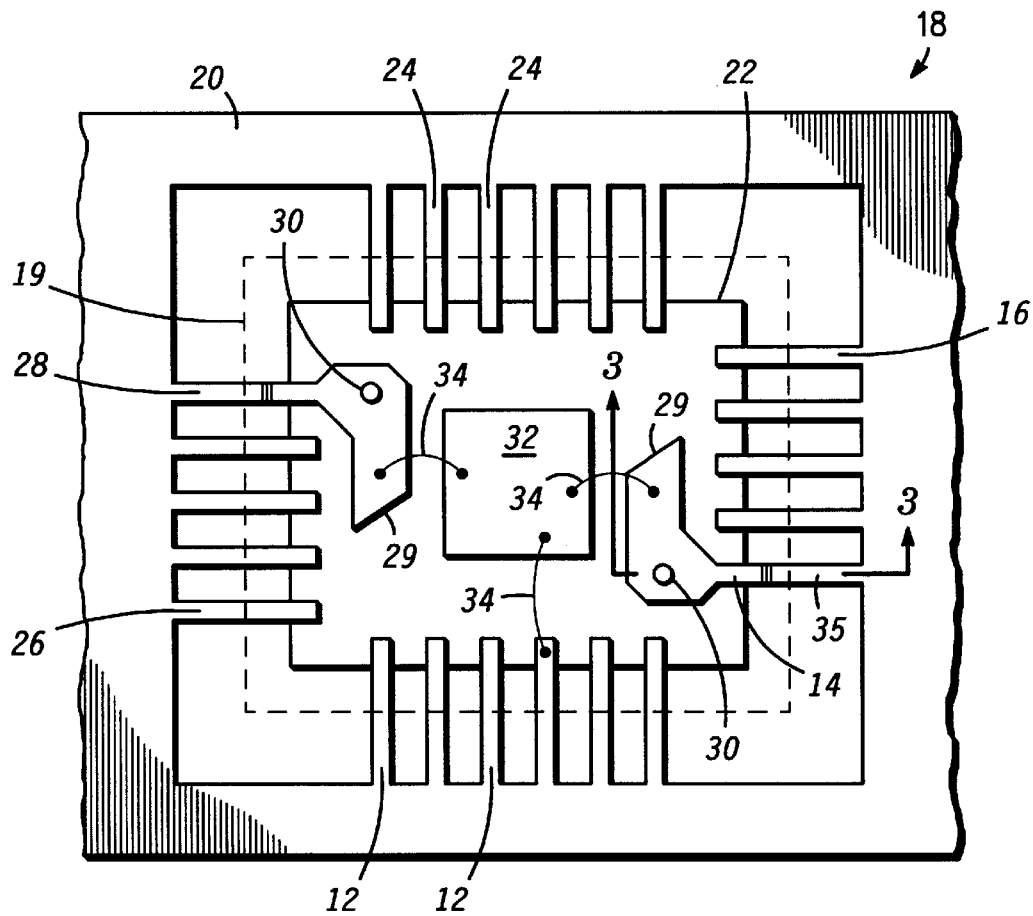
FIG. 2 is a top view of a leadframe assembly according to the present invention.

FIG. 2 illustrates a top view of a leadframe assembly 18 having a leadframe 20 attached to a heat sink 22 by down-set tabs 14 and 28. Pinholes 30 are provided for pins 36 (see FIG. 3). Preferably, pins 36 have a slip-fit with tabs 14 and 28 and have a press-fit with heat sink 22. Although pinning is used in this embodiment, one of skill in the art will recognize that numerous other means of attachment may be used to connect tabs 14 and 28 to heat sink 22. Leadframe 20 has leads 12, 16, 24, and 26 that extend over the sides of heat sink 22 and that are preferably disposed in the common plane defined by leadframe 20. Leads 12, 16, 24, and 26 are typically connected to a die 32, which is mounted on heat sink 22, by wirebonds 34. Also, tabs 14 and 28 optionally have an extension portion 29 for grounding die 32 to heat sink 22 using wirebonds 34.

A package boundary 19 corresponds to the outer boundary of package 10 (see FIG. 1), which is, for example, formed during a conventional molding process after die 32 and heat sink 22 are connected to leadframe 20. It should be appreciated that down-set tabs 14 and 28 according to the present invention connect leadframe 20 to heat sink 22 at a point within package boundary 19. Thus, in final package 10, tabs 14 and 28 are disposed substantially within package 10.

According to the present invention, heat sink 22 is substantially cut to its final dimensions prior to its attachment to leadframe 20. Thus, cutting of heat sink 22 after molding package 10 is not required. In addition, heat sink 22 remains substantially planar during assembly and need not be deformed to provide an offset from leadframe 20, for example, for staking. Therefore, heat sink 22 can be significantly thinner than heat sinks used in prior staking approaches. For example, heat sink 22 may have a thickness of about 0.9 mm (about 35 mils) instead of about 1.5 mm (about 60 mils) as required with prior staking. As another advantage, the total height of package 10 will be reduced due to the use of a thin heat sink. Yet another advantage of the use of individual heat sink 22 is that the induced coil set and camber problems associated with prior continuous heat sink strips are now eliminated.

Although a single heat sink is illustrated in FIG. 2, one of skill in the art recognizes that leadframe assembly 18 typically contains a single row of heat sinks that will be used for a plurality of packages. Alternatively, leadframe assembly 18 may also contain multiple rows of heat sinks 22 each connected to a common leadframe with down-set tabs.

Figure 3:
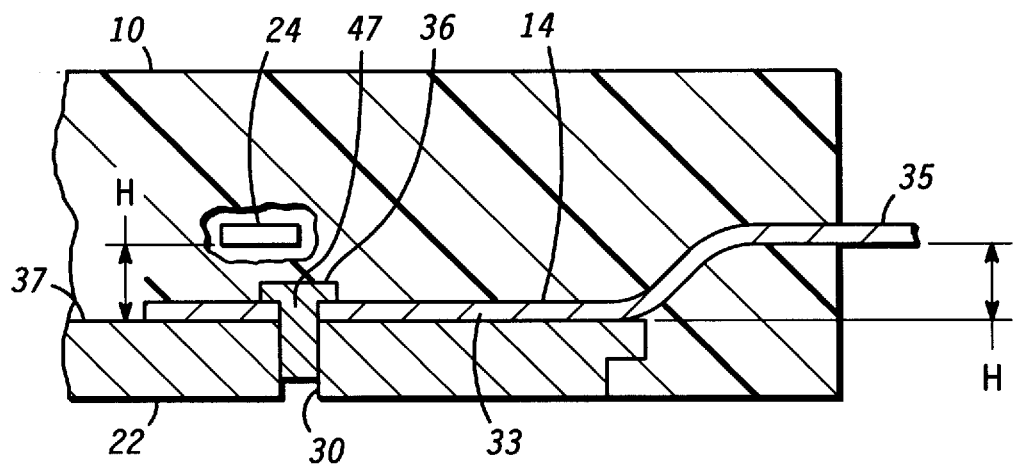
FIG. 3 is a cross-sectional view of a portion of the leadframe assembly of FIG. 2.

FIG. 3 is a cross-sectional view illustrating a portion of leadframe assembly 18 as indicated in FIG. 2. Down-set tab 14 is connected to heat sink 22 by pin 36 at a connection point 47 defined substantially as the center of pinhole 30. A connection portion 33 of tab 14 is flush with a top surface 37 of heat sink 22, and portion 33 is offset from leadframe 20 by a height H. An uppermost portion 35 of tab 14 joins with leadframe 20, and lead 24 and uppermost portion 35 are both disposed at height H above top surface 37. Package 10 is formed around tab 14 and over pin 36, for example, by conventional molding techniques.

In one method for forming leadframe assembly 18, a plurality of heat sinks 22 are pre-cut to a final size desired for package 10. Each of heat sinks 22 is connected to leadframe 20 using down-set tabs 14 and 28. Conventional materials may be used to form leadframe 20 and heat sink 22. Then, dies 32 are attached to heat sinks 22, and packages 10 are formed by a standard molding process. After molding, the excess portions of leadframe 20 are trimmed away, and leads 12, 16, 24, and 26 are formed into their final shape. Although leads 12, 16, 24, and 26 are shown in FIG. 1 as being formed downwards towards heat sink 22 (not shown in FIG. 1), in some cases it is desirable that leads 12, 16, 24, and 26 be formed upwards away from heat sink 22. This would be done, for example, where it is preferable to have heat sink 22 exposed to ambient air rather than in contact with a circuit board. Uppermost portions 35 of tabs 14 and 28 are typically removed to be flush with package 10. Alternatively, uppermost portions 35 may be formed into leads as done for leads 12, 16, 24, and 26.

An advantage of the present invention is that a four-sided package 10 can be formed with a bottom surface (not shown) of heat sink 22 exposed through the bottom (not shown) of package 10. This is possible due to the use of individual, singulated heat sinks 22 that permit leads 12, 16, 24, and 26 to extend over all four sides of each heat sink 22. In contrast, the prior continuous-heat-sink-strip approach prevents leads extending over a fourth side of each heat sink due to the presence of the continuous strip running in close proximity next to each fourth side.

Figure 4:
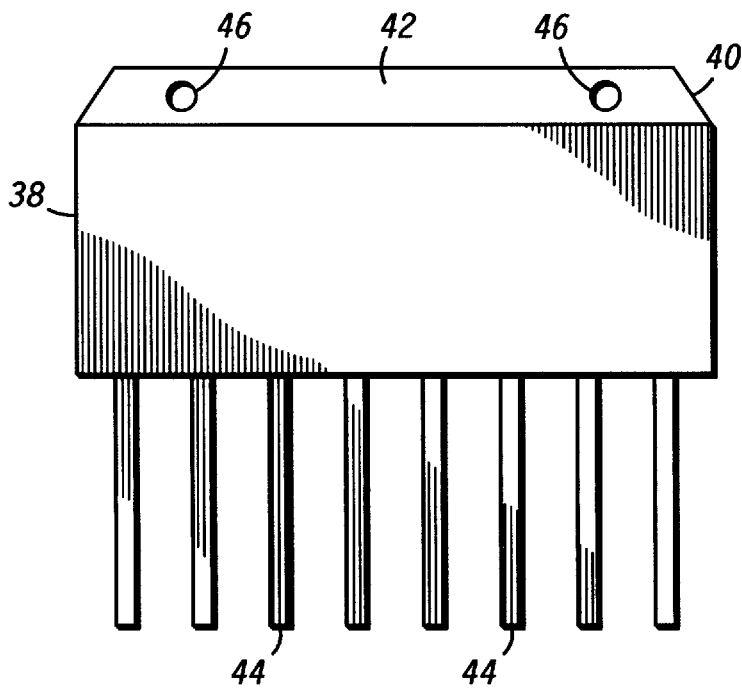
FIG. 4 is an electronic package according to an alternative embodiment of the present invention.

FIG. 4 is a front view of a package 38 according to an alternative embodiment of the present invention. Package 38 has leads 44 and a heat sink 40. A portion 42 of heat sink 40 extends outside the package boundary of package 38, and mounting holes 46 may be used for mounting heat sink 40 to a thermally conductive support. During assembly of package 38, heat sink 40 is connected to a leadframe (not shown) by a down-set tab according to the present invention.

By now, it should be appreciated that there has been provided a novel leadframe assembly for a semiconductor die disposed on a heat sink in a package. The leadframe assembly of the present invention significantly reduces the leadframe surface area required for connecting heat sink 22 to leadframe 20 during assembly. Further, heat sink 22 can be thinner than with prior approaches, and bowing of leadframe assembly 18 due to induced coil set and camber as in prior approaches is eliminated. Also, four-sided power packages with an exposed heat sink can now be manufactured.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A leadframe assembly for conducting thermal energy from a semiconductor die disposed in a package, comprising:

a heat sink; and a leadframe having a plurality of leads corresponding to said semiconductor die and having a down-set tab with a connection portion connected to said heat sink so that said leadframe is supported above said heat sink and said down-set tab is disposed substantially within said package and wherein said semiconductor die is disposed over a different region of said heat sink than said connection portion.

2. The assembly of claim 1 wherein said down-set tab comprises an extension portion for electrically grounding said semiconductor die to said heat sink.

3. The assembly of claim 1 wherein said plurality of leads extends over said heat sink and a wirebond connects said semiconductor die to at least one of said plurality of leads.

4. The assembly of claim 1 wherein an uppermost portion of said down-set tab and said plurality of leads are at a substantially identical height above a top surface of said heat sink.

5. The assembly of claim 4 wherein said heat sink is disposed substantially within a package boundary corresponding to said package.

6. The assembly of claim 1 wherein said heat sink has four sides and at least one of said plurality of leads extends over each of said four sides.

7. The assembly of claim 1 wherein said down-set tab is connected to said heat sink by a press-fit pin.

8. The assembly of claim 7 wherein said pin has a slip-fit with a hole in said down-set tab.

9. A leadframe assembly having a plurality of packages, including a first package and each formed around a semiconductor die, comprising:

a plurality of individual heat sinks, including a first heat sink, wherein said first heat sink corresponds to said first package; and a leadframe attached to said first heat sink at a connection point inside said first package so that said leadframe is disposed above said first heat sink and wherein said leadframe comprises a down-set tab with a connection portion and said leadframe is attached to said first heat sink by said down-set tab and wherein said semiconductor die is disposed over a different region of said heat sink than said connection portion.

10. The assembly of claim 9 wherein said down-set tab is connected to said first heat sink by a press-fit pin.

11. The assembly of claim 9 wherein said down-set tab comprises an extension portion for electrically grounding said semiconductor die to said first heat sink.

12. The assembly of claim 9 wherein said first heat sink is disposed substantially within a package boundary corresponding to said first package.

13. A leadframe assembly for a semiconductor die disposed in a package, comprising:

a heat sink; and a leadframe having a plurality of leads, disposed in a common plane and extending over said heat sink, and having a first down-set tab with a connection portion connected to said heat sink at a connection point wherein said first down-set tab extends over a first side of said heat sink, said leadframe is supported above said heat sink, and said connection point is disposed inside a package boundary corresponding to said package and wherein said semiconductor die is disposed over a different region of said heat sink than said connection portion.

14. The assembly of claim 13 further comprising a second down-set tab extending over a second side of said heat sink wherein said second side of said heat sink is opposite said first side of said heat sink and said leadframe is connected to said heat sink by essentially only said first down-set tab and said second down-set tab.

15. The assembly of claim 13 wherein said heat sink has a top surface and a portion of said first down-set tab, disposed in a region proximate to said connection point, is substantially flush with said top surface of said heat sink.

16. A method of forming a leadframe assembly for a plurality of packages, each enclosing one of a plurality of semiconductor dies, comprising the steps of:

providing a plurality of heat sinks, including a first heat sink, each substantially sized for one of said plurality of packages;

providing a leadframe having a plurality of leads in a common plane and a down-set tab with a connection portion corresponding to said first heat sink;

connecting said first heat sink to said down-set tab so that said plurality of leads is disposed above said first heat sink;

connecting a semiconductor die to said first heat sink so that said connection portion is not disposed underneath said semiconductor die; and forming said plurality of packages so that said down-set tab is substantially covered by one of said plurality of packages.

* * * * *